(12) United States Patent
Snai

(10) Patent No.: US 10,790,805 B2
(45) Date of Patent: Sep. 29, 2020

(54) IMPEDANCE CONVERTER TO ACHIEVE NEGATIVE CAPACITANCE AND/OR NEGATIVE INDUCTANCE FOR RADIO FREQUENCY FRONT END MATCHING

(71) Applicant: QUALCOMM Incorporated, San Diego, CA (US)

(72) Inventor: Makar Snai, Burdwan (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/673,261

(22) Filed: Aug. 9, 2017

(65) Prior Publication Data

US 2018/0337660 A1     Nov. 22, 2018

Related U.S. Application Data

(60) Provisional application No. 62/508,214, filed on May 18, 2017.

(51) Int. Cl.
*H03H 11/44*     (2006.01)
*H03F 3/193*     (2006.01)
(Continued)

(52) U.S. Cl.
CPC ............ *H03H 11/44* (2013.01); *H03F 1/14* (2013.01); *H03F 1/565* (2013.01); *H03F 3/193* (2013.01);
(Continued)

(58) Field of Classification Search
CPC ... G05F 1/00; G05F 1/561; H03F 1/00; H03F 1/3211; H03F 3/00; H03F 3/45179;
(Continued)

(56) References Cited

U.S. PATENT DOCUMENTS 8,493,155 B2     7/2013  Razafimandimby
8,872,587 B2     10/2014  Cheeranthodi et al.
(Continued)

FOREIGN PATENT DOCUMENTS

WO     2013006732 A2     1/2013
WO     2016151332 A1     9/2016
WO     2016151340 A1     9/2016

OTHER PUBLICATIONS

International Search Report and Written Opinion—PCT/US2018/030950—ISA/EPO—dated Aug. 9, 2018.

*Primary Examiner* — Lincoln D Donovan
*Assistant Examiner* — Dave Mattison
(74) *Attorney, Agent, or Firm* — Seyfarth Shaw LLP

(57) ABSTRACT

An impedance converter circuit achieves negative capacitance and/or negative inductance for radio frequency (RF) front end impedance matching for low noise amplifier (LNA) designs. The impedance converter circuit includes a first transistor coupled to a first RF input at a source of the first transistor. The impedance converter circuit also includes a second transistor coupled to a second RF input at a source of the second transistor. The second transistor is cross-coupled to the first transistor to form a cross-coupled pair of transistors. The cross-coupled pair of transistors is configured to generate a negative capacitance or a negative inductance based on a load impedance coupled to a drain of the first transistor and a drain of the second transistor.

19 Claims, 12 Drawing Sheets

(51) Int. Cl.
*H03F 1/56* (2006.01)
*H03F 1/14* (2006.01)
*H03H 11/48* (2006.01)
*H03H 7/09* (2006.01)
*H03H 7/38* (2006.01)
*H03H 11/04* (2006.01)
*H03H 11/34* (2006.01)
*H03H 11/52* (2006.01)
*H04B 1/04* (2006.01)

(52) U.S. Cl.
CPC ............... *H03H 7/09* (2013.01); *H03H 7/38* (2013.01); *H03H 11/0466* (2013.01); *H03H 11/346* (2013.01); *H03H 11/48* (2013.01); *H03H 11/525* (2013.01); *H04B 1/0458* (2013.01); *H03F 2200/165* (2013.01); *H03F 2200/222* (2013.01); *H03F 2200/369* (2013.01); *H03F 2203/45141* (2013.01); *H03F 2203/45562* (2013.01)

(58) Field of Classification Search
CPC . H03F 3/45197; H03F 3/45475; H03H 11/00; H03H 11/0466; H03H 11/346; H03H 11/44; H03H 11/525; H03H 7/00; H03H 7/09; H03H 7/38; H04B 1/00; H04B 1/0458
USPC .......................................................... 327/103
See application file for complete search history.

(56) References Cited

U.S. PATENT DOCUMENTS

| | | |
|---|---|---|
| 8,963,641 B1 | 2/2015 | Liu |
| 8,988,173 B2 | 3/2015 | Hitko et al. |
| 10,340,889 B1* | 7/2019 | Xu .................... H01Q 5/335 |
| 2011/0121907 A1* | 5/2011 | Kanai .................. G01C 19/56 331/65 |
| 2015/0318607 A1* | 11/2015 | Chieh ..................... H01Q 1/36 343/749 |
| 2017/0070197 A1 | 3/2017 | Sivonen et al. |

* cited by examiner

IMPEDANCE CONVERTER TO ACHIEVE NEGATIVE CAPACITANCE AND/OR NEGATIVE INDUCTANCE FOR RADIO FREQUENCY FRONT END MATCHING

CROSS-REFERENCE TO RELATED APPLICATION

The present application claims the benefit of U.S. Provisional Patent Application No. 62/508,214, filed on May 18, 2017, and titled "IMPEDANCE CONVERTER TO ACHIEVE NEGATIVE CAPACITANCE AND/OR NEGATIVE INDUCTANCE FOR RADIO FREQUENCY FRONT END MATCHING," the disclosure of which is expressly incorporated by reference herein in its entirety.

TECHNICAL FIELD

The present disclosure generally relates to impedance matching for antennas and/or low noise amplifiers (LNAs). More specifically, aspects of the present disclosure relate to an impedance converter circuit to achieve negative capacitance and/or negative inductance for radio frequency (RF) front end impedance matching.

BACKGROUND

Amplifiers are commonly used in various electronic devices to provide signal amplification. Different types of amplifiers are available for different uses. For example, a wireless device such as a cellular phone may include a transmitter and a receiver for bi-directional communications. The receiver may utilize a low noise amplifier (LNA), the transmitter may utilize a power amplifier (PA), and the receiver and transmitter may utilize variable gain amplifiers (VGAs).

A receiver may include an LNA coupled to an antenna via various front end circuit blocks. These circuit blocks may perform functions such as filtering, switching between the transmitter and the receiver, impedance matching, etc. An impedance matching circuit may be coupled between the antenna and the receiver and may perform impedance matching for the antenna and/or the LNA. The impedance matching circuit may be implemented with discrete components. The discrete components increase the cost and size of the receiver.

SUMMARY

In an aspect of the present disclosure, a method of generating a negative impedance with a negative impedance converter circuit, is presented. The method includes receiving a first signal of a differential radio frequency signal at a source of a first transistor of a cross-coupled pair of transistors and a second signal of the differential radio frequency signal at a source of a second transistor of the cross-coupled pair of transistors. The method also includes generating a negative capacitance or negative inductance based on a load impedance coupled to a drain of the first transistor and a drain of the second transistor.

Another aspect discloses a negative impedance converter circuit. The negative impedance converter circuit includes a first transistor coupled to a first radio frequency (RF) input at a source of the first transistor. The negative impedance converter circuit also includes a second transistor coupled to a second RF input at a source of the second transistor. The second transistor is cross-coupled to the first transistor to form a cross-coupled pair of transistors. The cross-coupled pair of transistors generates a negative capacitance or a negative inductance based on a load impedance coupled to a drain of the first transistor and a drain of the second transistor.

In yet another aspect of the present disclosure, a negative impedance converter circuit is presented. The negative impedance converter circuit includes means for generating an opposition to a current when a voltage is applied. The negative impedance converter circuit also includes means for generating a negative capacitance or negative inductance based on the opposition generating means coupled to a drain of a first transistor of a cross-coupled pair of transistors and a drain of a second transistor of the cross-coupled pair of transistors.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
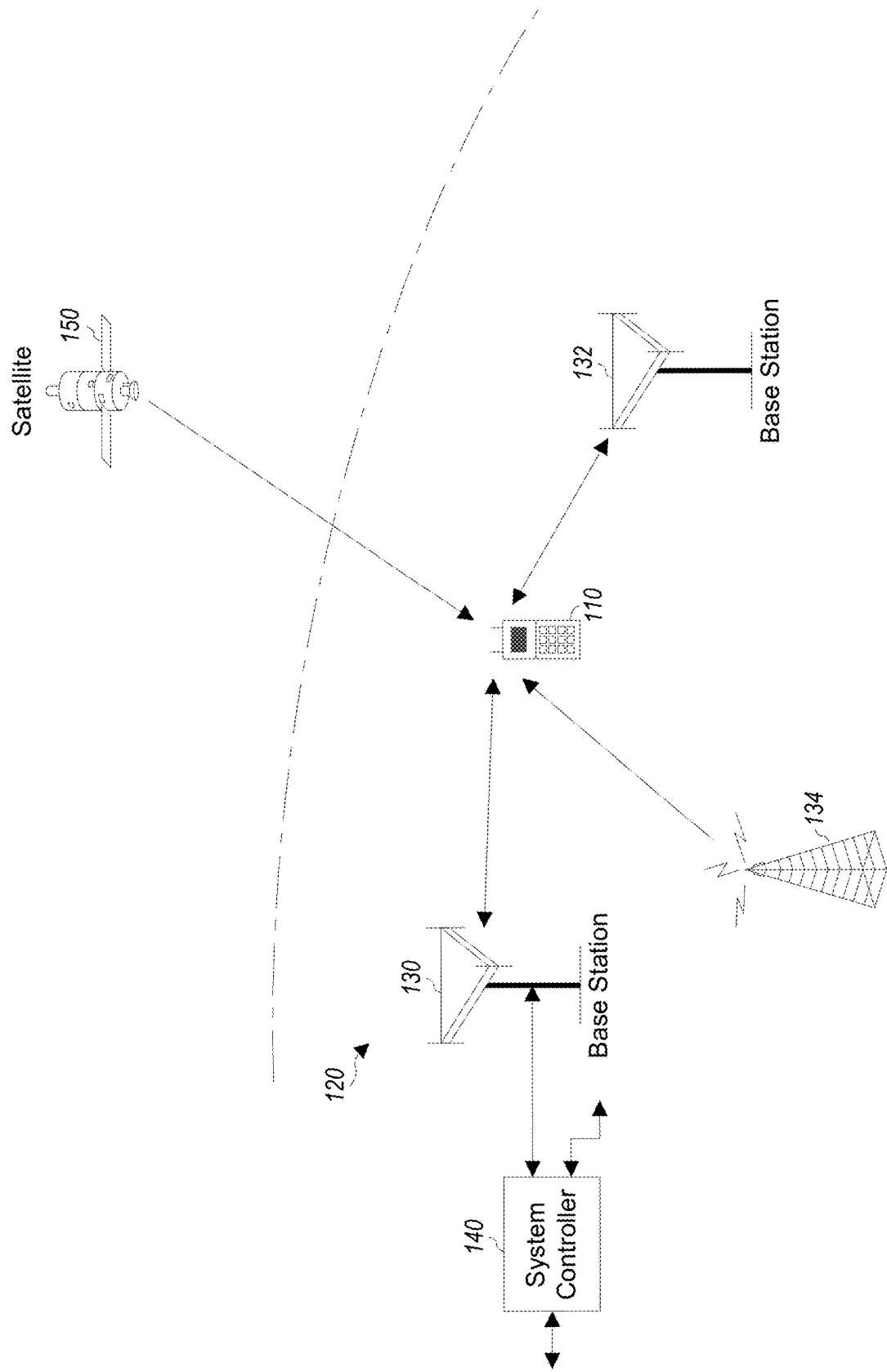
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR" and the use of the term "or" is intended to represent an "exclusive OR".

Aspects of the present disclosure are directed to an impedance converter circuit to achieve negative capacitance and/or negative inductance for radio frequency (RF) front end impedance matching for low noise amplifier (LNA) designs. An LNA amplifies an input radio frequency signal and provides an output signal (e.g., an output current or voltage signal). The impedance converter circuit is a negative impedance converter that converts impedance of a load at the input of the LNA. For example, a load impedance ZL is converted to a negative impedance Zin.

The impedance converter includes a main circuit and a bias circuit to support the main circuit. The main circuit of the impedance converter includes a cross-coupled pair of transistors, a first current source transistor, a second current source transistor, a first current sink transistor and a second current sink transistor. The cross-coupled pair of transistors includes a first transistor and a second transistor. Inputs (e.g., input signals to the LNA) are applied to the sources of the cross coupled pair of transistors. The cross-coupled pair of transistors generates a negative capacitance and/or a negative inductance based on a load impedance implemented for the LNA of a radio frequency front end. The cross-coupled pair of transistors provides a differential input rather than a single ended grounded configuration. For example, the cross-coupled pair of transistors may be N type metal oxide semiconductor (NMOS) field effect transistors (FETs).

To provide the differential input, the main circuit is divided into a first path and a second path. The first path includes the first transistor, the first current source transistor, and the first current sink transistor, while the second path includes the second transistor, the second current source transistor, and the second current sink transistor. The gates of each of the transistors of the cross-coupled pair of transistors are connected to the drains of the opposite transistor. For example, a gate of the first transistor is connected to the drain of the second transistor. Similarly, a gate of the second transistor is connected to the drain of the first transistor.

In one aspect of the disclosure, the load impedance ZL is implemented across a drain of the first transistor and a drain of the second transistor. A radio frequency input is coupled to a source of the first transistor and a source of the second transistor. For example, the radio frequency input may be a differential radio frequency input such that a first input (e.g., positive input) of the differential radio frequency input is coupled to the source of the first transistor and a second input (e.g., negative input) of the differential radio frequency input is coupled to the source of the second transistor.

The impedance converter further includes a first current source transistor and a second current source transistor respectively coupled to the drain of the first transistor and the drain of the second transistor to provide stable current to the cross-coupled pair of transistors. The first current source transistor and the second current source transistor provide identical current to each of the first transistor and the second transistor.

The first current sink transistor and the second current sink transistor are respectively coupled to the source of the first transistor and the source of the second transistor. The negative impedance Zin (e.g., negative capacitance or negative inductance) is realized across a drain of the first current sink transistor and a drain of the second current sink transistor.

The bias circuit (e.g., a mirror circuit) of the impedance converter generates a control signal to bias the first current sink transistor and the second current sink transistor so that the current through the first path and the second path are substantially the same. The bias circuit includes a third current source transistor to mirror the first current source transistor and the second current source transistor, a third current sink transistor to mirror the first current sink transistor and the second current sink transistor, and a third transistor to mirror the first transistor and the second transistor. The first current source transistor, the second current source transistor, and the third current source transistor are supported by a current source (e.g., a transistor circuit) or biased by the current source.

The transistors of the bias circuit may be implemented in a parallel configuration with respect to the transistors of the main circuit. In operation, the bias circuit mirrors the main circuit albeit as a scaled down version. For example, the bias circuit mirrors the first path and the second path of the main circuit. However, the current through the bias circuit is scaled down relative to the current through the first path and the second path. To mirror the voltage drop across the cross-coupled pair, the third transistor is implemented as a diode-connected transistor where a drain of the third transistor is connected to a gate of the third transistor. In one aspect of the disclosure, a drain of the third current sink transistor is connected to a gate of the third current sink transistor to provide a gate to source voltage of the third current sink transistor to bias the first current sink transistor and the second current sink transistor.

The negative impedance element (e.g., negative capacitance or inductance) is generated such that the impedance converter reduces or even eliminates an undesired negative resistance element that is inversely proportional to the transconductance of the cross-coupled transistors. In one aspect, the negative impedance element is eliminated by coupling the load impedance ZL to the drains of the first and second transistors and coupling the differential radio frequency inputs to the sources of the first transistor and the second transistor of the cross-coupled pair. The load impedance ZL can be capacitive to obtain a negative capacitance and the load impedance ZL can be inductive to obtain a negative inductance. Thus, a sign inversion of the load impedance is achieved by the impedance converter circuit.

In one aspect, the elimination of the negative resistance element is achieved due to the existence of negative feedback current through the first and second transistors of the cross-coupled pair at the sources, which correspond to the inputs for the differential radio frequency signal. For example, the negative feedback current is achieved through the cross-coupled pair during radio frequency (RF) frequencies, which makes the impedance converter circuit attractive to use in high (RF) frequencies. The negative feedback current may be detected at any point (e.g., the first source and the second source) of a loop including the cross-coupled pair of transistors.

The negative impedance may be determined based on a small signal model of the cross-coupled pair. For example, the differential radio frequency signal may be applied to the sources of the cross-coupled pair and a loop gain of the cross-coupled pair is set higher than unity to achieve the negative impedance. Thus, positive input resistance with converted ZL is achieved by coupling the radio frequency signal to the input ports at the sources (e.g., first source and second source) of the cross-coupled pair of transistors.

The aspects of the present disclosure may be implemented in the system of FIGS. 1, 2, 3 and 10.

FIG. 1 shows a wireless device 110 communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
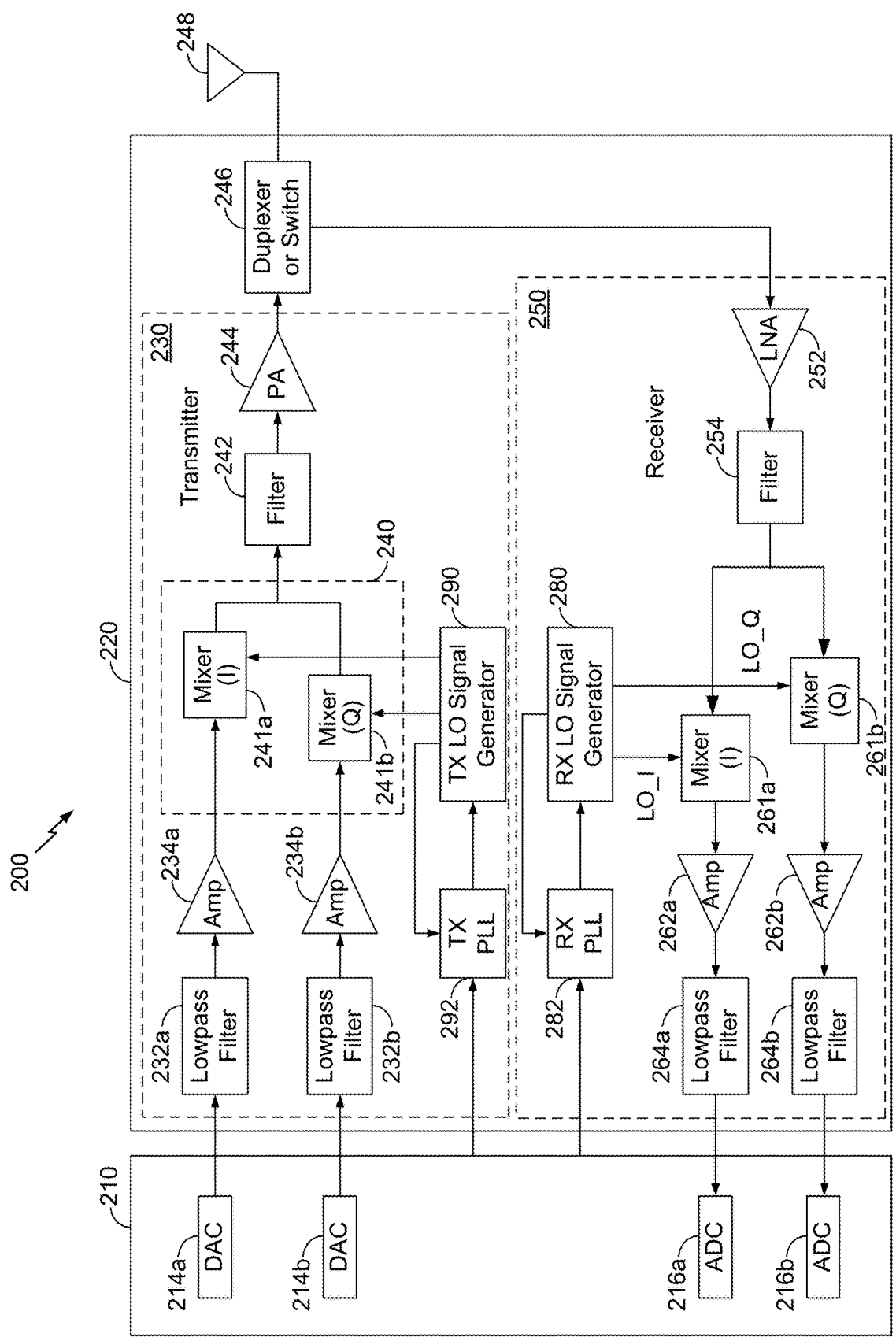
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214*a* and 214*b* for converting digital signals generated by the data processor 210 into the in-phase (I) and quadrature (Q) analog output signals (e.g., I and Q output currents) for further processing.

Within the transmitter 230, lowpass filters 232*a* and 232*b* filter the in-phase (I) and quadrature (Q) analog transmit signals, respectively, to reduce undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
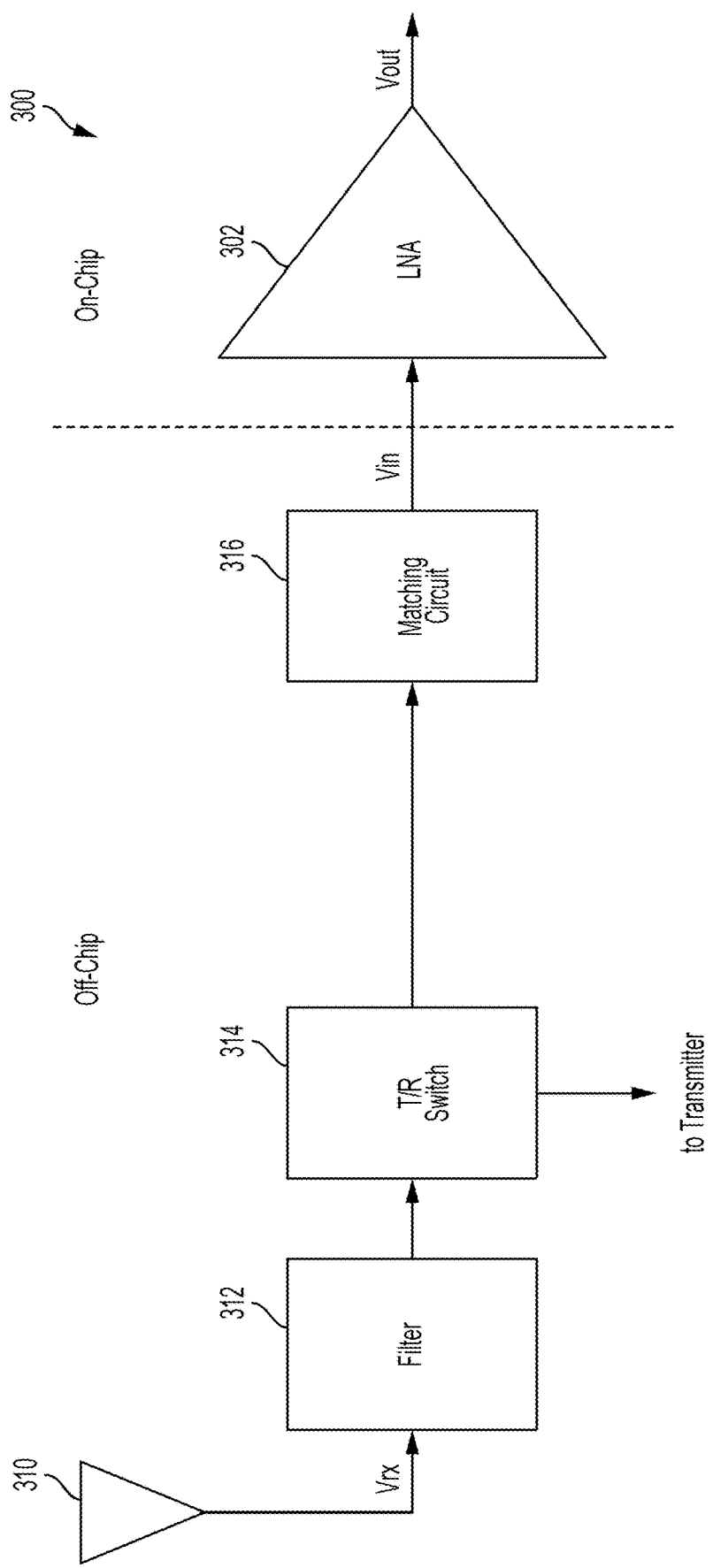
FIG. 3 shows an exemplary design of a front end of the wireless device.

FIG. 3 shows an exemplary design of a front end of the wireless device. The wireless device 300 may be a user equipment, a cellular phone, or some other device. The wireless device 300 includes a transmitter and a receiver. For simplicity, only a portion of the receiver is shown in FIG. 3, and the transmitter is not shown.

In a receive path, an antenna 310 receives signals transmitted by base stations and/or other transmitter stations and provides a received radio frequency (RF) signal, Vrx. A filter (e.g., bandpass filter) 312 filters the received RF signal to remove out-of-band noise and undesired signals and provides a filtered RF signal. A transmit/receive (T/R) switch 314 connects the receiver or a transmitter to the antenna 310 at any given moment. In a receive mode, the receiver is selected, and the T/R switch 314 routes the filtered RF signal from the filter 312 to a matching circuit 316. In a transmit mode, the transmitter is selected, and the T/R switch 314 receives a transmit RF signal from the transmitter and routes the transmit RF signal to the filter 312 for transmission via the antenna 310.

The matching circuit 316 performs input impedance matching for a low noise amplifier (LNA) 302 and provides an input RF signal Vin to the LNA. The matching circuit 316 may be implemented with inductors, capacitors, etc. The LNA 302 amplifies the input RF signal Vin and provides an output RF signal Vout.

The LNA 302 may be implemented on-chip within an integrated circuit (IC), which may be an analog IC, an RF IC (RFIC), a mixed signal IC, etc. The filter 312, the T/R switch 314, and the matching circuit 316 may be implemented off-chip and external to the IC. Some or all of these circuit blocks (e.g., T/R switch 314 and the matching circuit 316) may be implemented with external discrete components, which may then increase the cost and size of wireless device 300.

The filter 312, the T/R switch 314, and matching circuit 316 may be coupled in cascade, as shown in FIG. 3. These circuit blocks may be implemented with passive circuits. Each of these circuit blocks may then have some insertion loss, which may then degrade the noise figure of the receiver.

Figure 4:
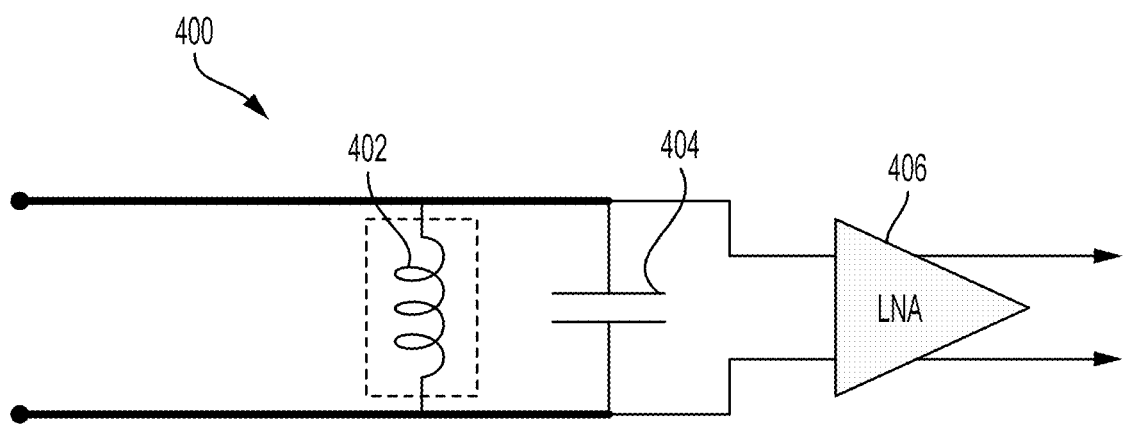
FIG. 4 illustrates an implementation of a feedback receiver (FBRX) front end with an inductor (e.g., input parallel inductor) to resonate out an off capacitor.

FIG. 4 illustrates an implementation of a feedback receiver (FBRX) front end with an inductor (e.g., input parallel inductor) to resonate out an off capacitor. The RF front end circuit 400 includes a low noise amplifier (LNA) 406. Impedance matching is specified for the RF front end circuit 400. An on-chip inductor 402 may be used to resonate/cancel out parasitic capacitance (e.g., associated with an off capacitor 404). The off capacitor 404 may be about two pico farads (pF). Because the on-chip inductor 402 occupies a large area in the RF front end circuit 400 (e.g., 130 micrometers by one hundred and twenty five micrometers (130 μm×125 μm)), it is desirable to realize or achieve a negative capacitance (−C) to resonate/cancel out the off chip capacitance (e.g., from the off capacitor 404) with an added benefit of reducing area occupied in the RF front end circuit 400 (or RF integrated circuit receiver or other receiver front end applications).

Figure 5:
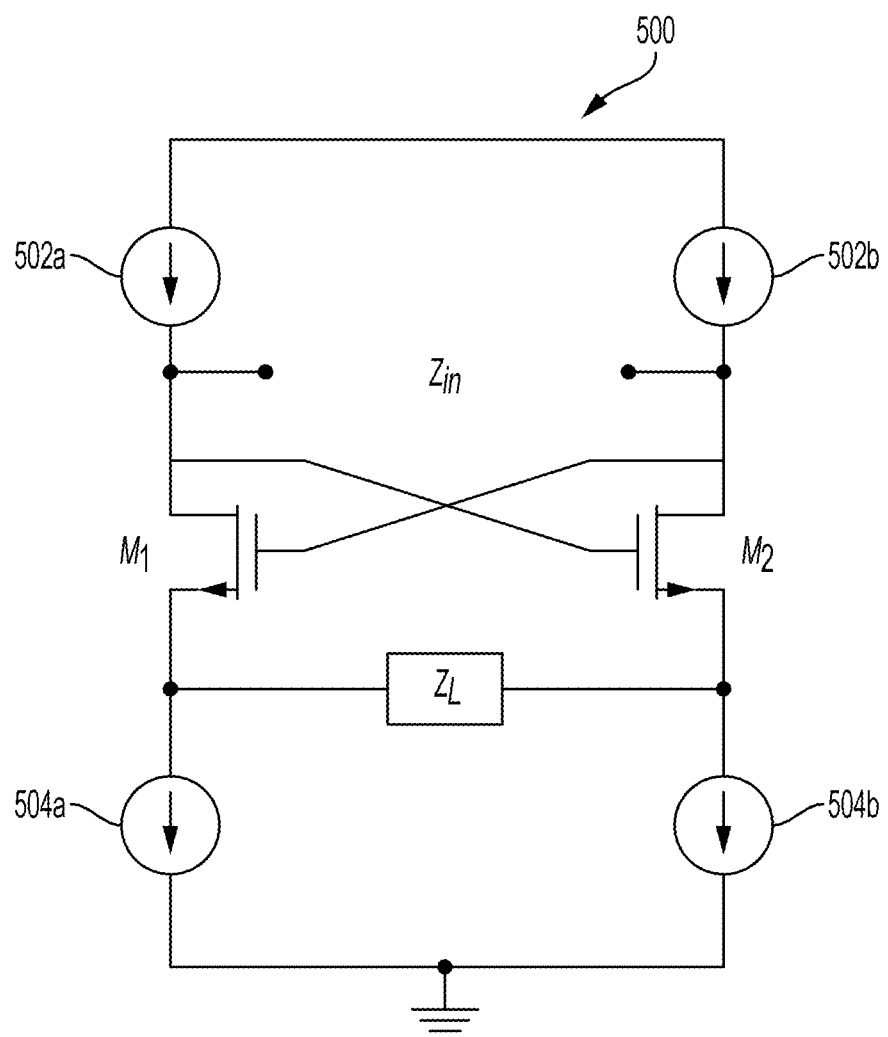
FIG. 5 illustrates a radio frequency circuit including a cross-coupled pair of transistors to realize a negative capacitance.

FIG. 5 illustrates a radio frequency circuit 500 including a cross-coupled pair of transistors (e.g., M1 and M2) to realize a negative capacitance. The circuit 500 includes a pair of current sources 502a and 502b, the cross-coupled transistors M1 and M2, a pair of current sinks 504a and 504b, a load impedance ZL and an input impedance Zin. In this illustration, the load impedance ZL is coupled between a source of the transistor M1 and a source of the transistor M2. The transistors M1 and M2 are cross-coupled such that a gate of the transistor M1 is coupled to a drain of the transistor M2 and a gate of the transistor M2 is coupled to a drain of the transistor M1. The input impedance Zin is realized between the drain of the transistor M1 and the drain of the transistor M2. The current sources 502a and 502b are respectively coupled to the drain of the transistor M1 and the drain of the transistor M2. The current sinks 504a and 504b are respectively coupled to the source of the transistor M1 and the source of the transistor M2.

In this case, the cross-coupled pair of transistors effectively acts as a gyrator and thereby provides a negative capacitance (−C) element. A gyrator is a passive, linear, lossless, two-port electrical network element. The realized input impedance is given by:

$$Z_{in} = -2z_s - \frac{2}{g_m} = -Z_L - \frac{2}{g_m},$$

where $g_m$ is a transconductance of the transistor M1 or M2; and $2z_s$ is an impedance at the drain of the transistors M1 or M2.

The cross-coupled pair of transistors of FIG. 5 also realizes a real negative impedance (−2/gm), which causes instability. Negative impedance circuits (that realize the real negative impedance) are not well suited for most applications. For example, extra circuit techniques are specified to minimize the effect of the negative impedance. Moreover, the impedance converter in this circuit topology of FIG. 5 may not realize a negative inductance (−L) element. Because this circuit only achieves a passive negative capacitance (−C) element, the circuit is not used as part of active blocks in a signal path of a low noise amplifier (LNA).

Some implementations use internal positive feedback to realize the −C element. Further, the realized −C element can be equivalently used to realize series inductance. However, in these implementations the realized −C element varies across frequency. In addition, the circuit topology using the internal positive feedback and the corresponding realized −C element are unsuitable for broadband applications. The realized −C element strictly constrains the circuit. For example, the realized −C element constrains the circuit to a conductance of gc=0, which is difficult to realize.

Aspects of the present disclosure are directed to a cross-coupled pair of transistors for an improved impedance converter circuit. The aspects of the present disclosure rely on a symmetric property of the cross-coupled pair to realize a −C/−L element along with positive real impedance, as shown in FIG. 6.

Figure 6:
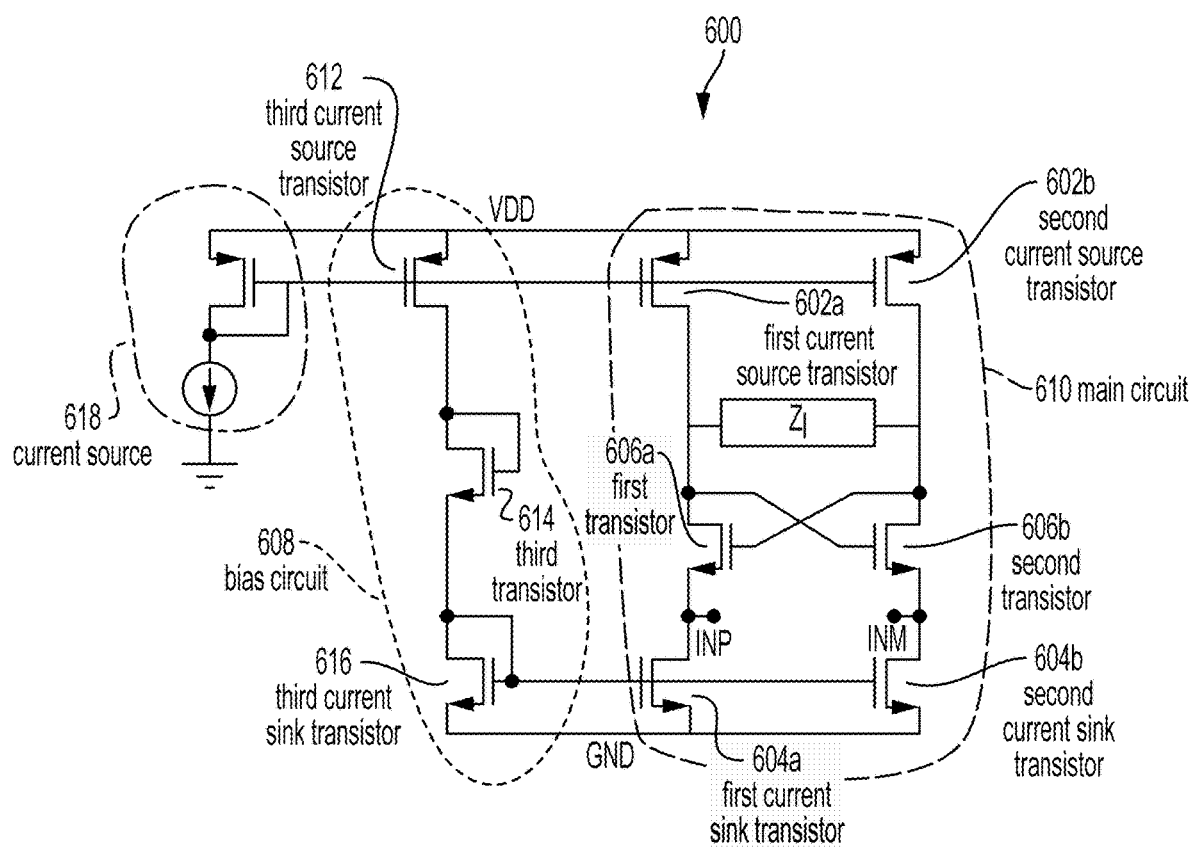
FIG. 6 illustrates an impedance converter circuit according to aspects of the present disclosure.

FIG. 6 illustrates an impedance converter circuit 600 according to aspects of the present disclosure. The impedance converter circuit 600 includes a main circuit 610 and a bias circuit 608 to support the main circuit 610. The main circuit 610 includes a cross-coupled pair of transistors (e.g., a first transistor 606a and a second transistor 606b), a first current source transistor 602a, a second current source transistor 602b, a first current sink transistor 604a and a second current sink transistor 604b. The cross-coupled pair of transistors 606a and 606b generates the negative capacitance and/or the negative inductance based on a load impedance implemented for the LNA of a radio frequency front end. The cross-coupled pair of transistors 606a and 606b provides a differential input rather than a single ended grounded configuration.

To provide the differential input, the main circuit 610 is divided into a first path and a second path. The first path includes the first transistor 606a, the first current source transistor 602a, and the first current sink transistor 604a, while the second path includes the second transistor 606b, the second current source transistor 602b, and the second current sink transistor 604b. In one aspect, INP is a positive input signal port for receiving a positive input signal to the first path, and the INM is a negative input signal port to receive a negative input signal to the second path. The gates of each of the transistors 606a and 606b of the cross-coupled pair of transistors are connected to the drains of the opposite transistor. For example, a gate of the first transistor 606a is connected to a drain of the second transistor 606b. Similarly, a gate of the second transistor 606b is connected to a drain of the first transistor 606a.

The impedance converter circuit 600 is a negative impedance converter that converts impedance of a load at the input of the LNA (e.g., LNA 406). For example, a load impedance ZL is converted to a negative impedance Zin between the positive input signal port INP and the negative input signal port INM.

The first current source transistor 602a and the second current source transistor 602b are respectively coupled to the drain of the first transistor 606a and the drain of the second transistor 606b to provide stable current to the cross-coupled pair of transistors 606a and 606b. The first current sink transistor 604a and the second current sink transistor 604b are respectively coupled to the source of the first transistor 606a and the source of the second transistor 606b. The negative impedance Zin (e.g., negative capacitance or negative inductance) is provided across a drain of the first current sink transistor 604a and a drain of the second current sink transistor 604b.

The bias circuit 608 (e.g., a mirror circuit) of the impedance converter circuit 600 generates a control signal to bias the first current sink transistor 604a, the second current sink transistor 604b, the first current source transistor 602a, and/or the second current source transistor 602b so that the current through the first path and the second path are substantially the same. The bias circuit 608 includes a third current source transistor 612 to mirror the first current source transistor 602a and the second current source transistor 602b, a third current sink transistor 616 to mirror the first current sink transistor 604a and the second current sink transistor 604b, and a third transistor 614 to mirror the first transistor 606a and the second transistor 606b. The first current source transistor 602a, the second current source transistor 602b, and the third current source transistor 612 are supported by a current source circuit 618 (e.g., a transistor circuit) or biased by the current source circuit 618. The bias circuit 608 and the current source circuit 618 may form an overall bias circuit. The main circuit 610 is the active section of the impedance converter circuit 600 while the remaining sections are biasing circuitry (e.g., the bias circuit 608 and the current source circuit 618).

Figure 7A:
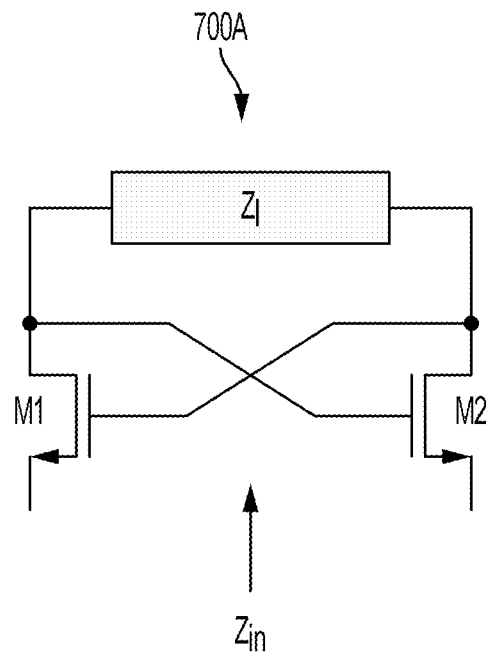
FIG. 7A illustrates a portion of an impedance converter circuit including a cross-coupled pair of transistors, a load impedance and a negative impedance according to aspects of the present disclosure.

FIG. 7A illustrates a portion of an impedance converter circuit including a cross-coupled pair of transistors M1 and M2, a load impedance ZL and a realized negative impedance Zin according to aspects of the present disclosure.

Figure 7B:
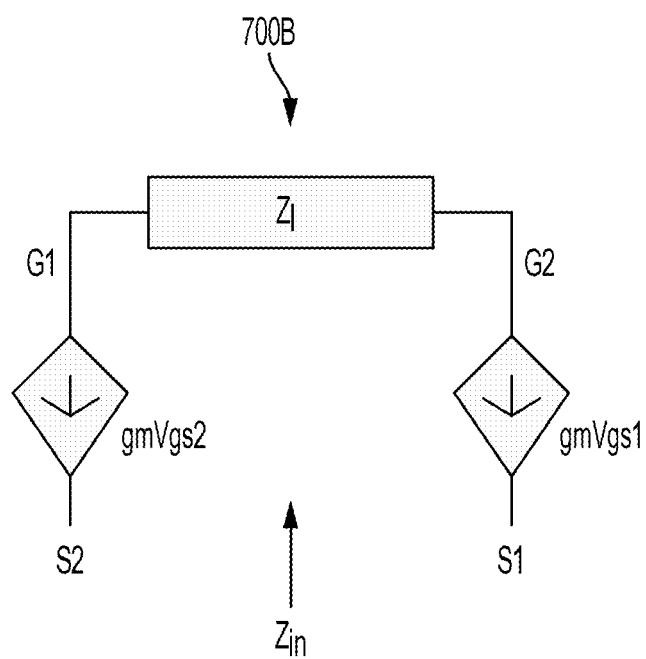
FIG. 7B illustrate a small signal equivalent of the impedance converter circuit of FIG. 7A according to aspects of the present disclosure.

FIG. 7B illustrate a small signal equivalent of the impedance converter circuit of FIG. 7A according to aspects of the present disclosure. The small signal drain current of the first transistor M1 is given by $g_m V_{gs1}$ and the small signal drain current of the second transistor M2 is given by $g_m V_{gs2}$. The gate and the source of the transistors M1 and M2 are respectively represented by G1 and G2 and S1 and S2 in FIG. 7B. For example, from the small signal model of FIG. 7B, the realized impedance can be represented as follows:

$$Zin = \frac{2}{(g_m)} - ZL$$

Thus, the cross-coupled pair of transistors M1 and M2 of FIGS. 7A and 7B realizes a real positive impedance (2/gm) and a non-real negative impedance (−ZL). The aspects of the present disclosure have the flexibility to realize either a −L or −C element by inserting an inductor or a capacitor as the load impedance (ZL) element, without varying based on frequency.

Figure 7C:
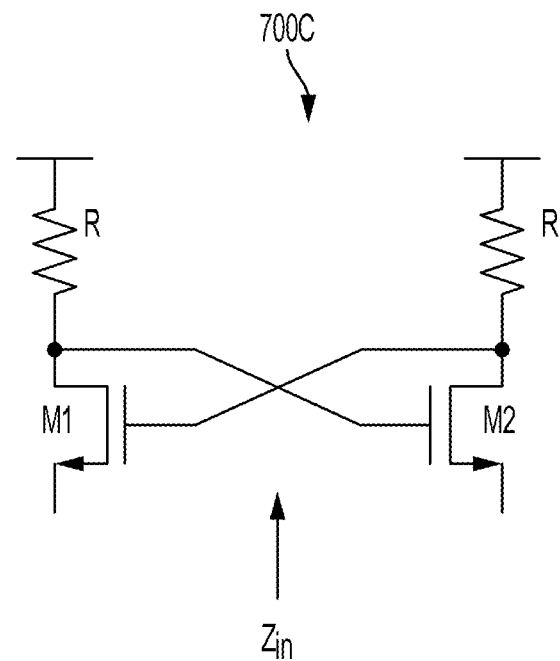
FIG. 7C illustrates a portion of a conventional impedance converter circuit.

FIG. 7C illustrates a portion 700C of a conventional impedance converter circuit. FIG. 7C shows a resistor R connected to the each of the drains of the first transistor M1 and the second transistor M2 of the cross-coupled pair of transistors. Based on a small signal model of FIG. 7C, the realized impedance may be represented as follows:

$$Zin = \frac{2}{(g_m)} - R,$$

where gm is a transconductance of the transistor M1 or M2, and R is a resistance.

Figure 7D:
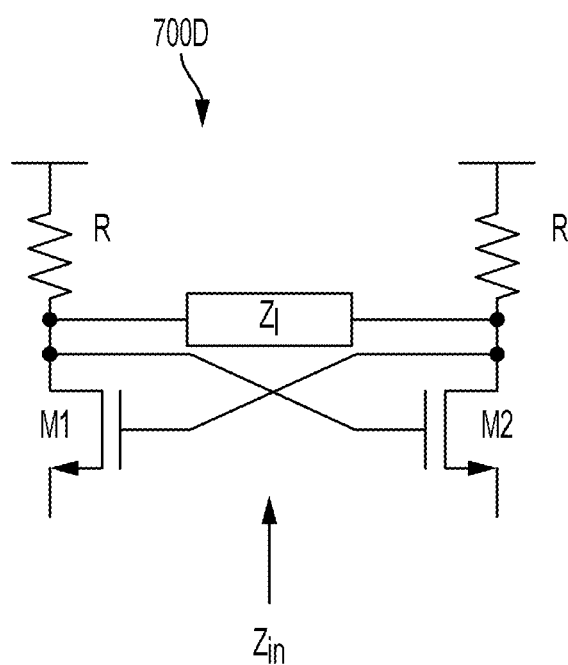
FIG. 7D illustrates of a portion of an impedance converter circuit of according to aspects of the present disclosure.

FIG. 7D illustrates of a portion of an impedance converter circuit of according to aspects of the present disclosure. FIG. 7D shows a resistor R connected to the each of the drains of the first transistor M1 and the second transistor M2 of the cross-coupled pair of transistors. In addition, a load impedance ZL is connected between the drains of the first transistor M1 and the second transistor M2. Based on a small signal model of FIG. 7D, the realized impedance may be represented as follows:

$$Zin = \frac{2}{(g_m)} - Zl - \frac{1}{2*w^2*c^2*R},$$

where w is angular frequency, and C is a capacitance.

The aspects of the present disclosure have the flexibility to realize either a −L or −C element by including an inductor or a capacitor as the load impedance (ZL) element, without varying based on frequency. Thus, $c^2$ can be replaced with $L^2$ in the equation above, if an inductor is substituted for the capacitor. The third term in the Zin equation is negligible at high frequency.

Figure 7E:
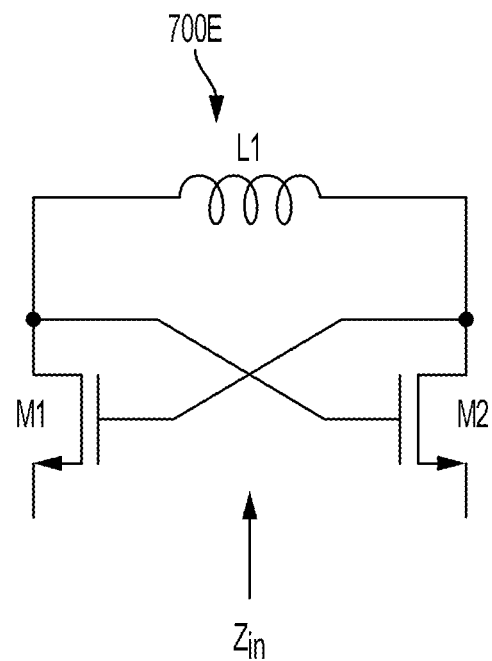
FIG. 7E illustrates an impedance converter including an inductor as a load impedance according to aspects of the present disclosure.

FIG. 7E illustrates a portion 700E of an impedance converter including an inductor L1 as the load impedance according to aspects of the present disclosure. For example, the negative inductance may be achieved by implementing the inductor L1 (e.g., 1.2 nH) as the load impedance ZL. The realized reactance varies minimally across process, voltage and temperature (PVT) variations.

Figure 7F:
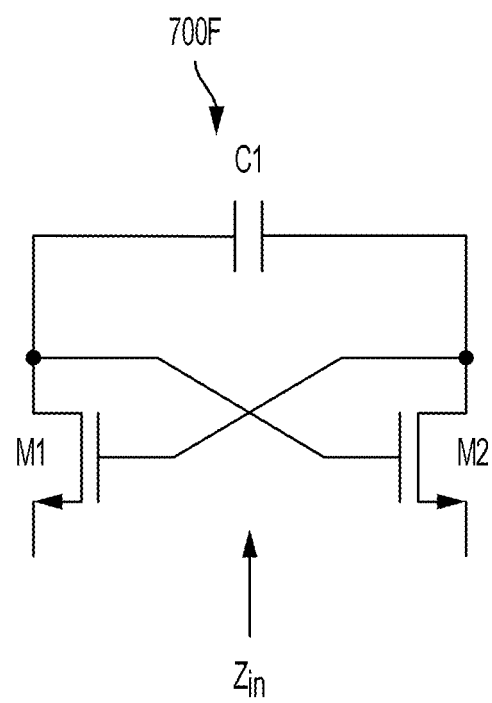
FIG. 7F illustrates an impedance converter including a capacitor as a load impedance according to aspects of the present disclosure.

FIG. 7F illustrates a portion 700F of an impedance converter including a capacitor C1 as the load impedance according to aspects of the present disclosure. For example, a negative capacitance may be achieved by implementing a capacitor C1 (e.g., 1.2 pF) as the load impedance ZL across the cross-coupled transistors M1 and M2. Similar to the inductor implementation, the realized reactance varies minimally across process, voltage and temperature (PVT) variations.

Figure 8:
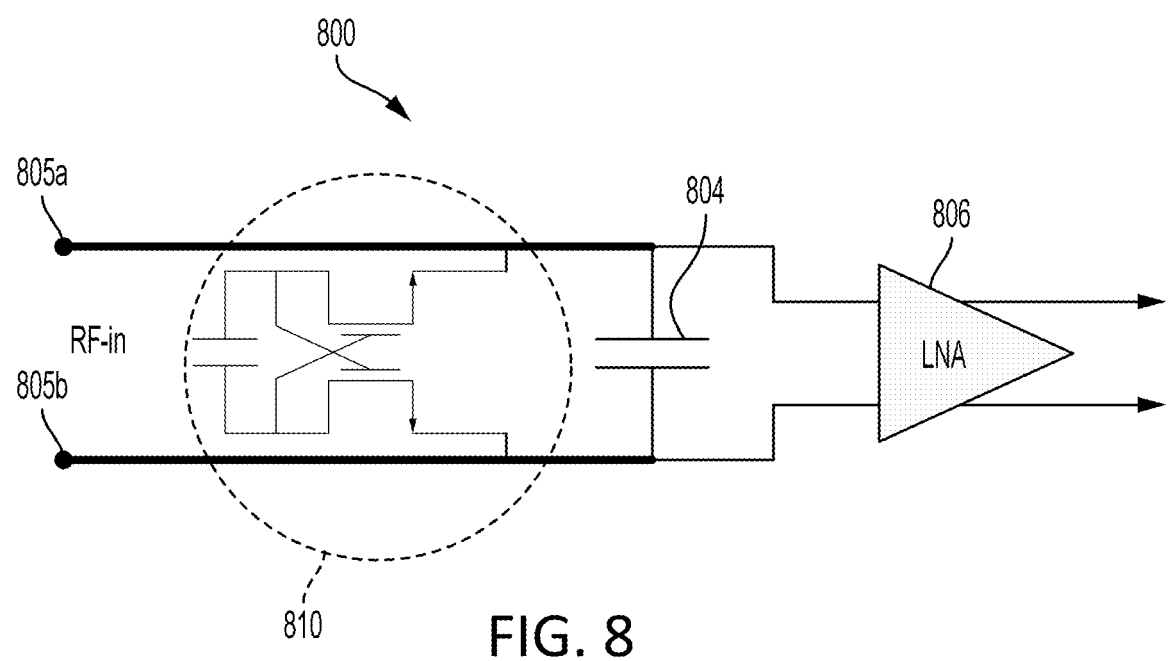
FIG. 8 illustrates an impedance converter coupled to a radio frequency (RF) signal port to realize a negative capacitance according to aspects of the present disclosure.

FIG. 8 illustrates an impedance converter 810 coupled to radio frequency (RF) signal ports 805a and 805b of a radio frequency integrated circuit 800 to realize a negative capacitance according to aspects of the present disclosure. The radio frequency integrated circuit 800 includes a low noise amplifier (LNA) 806 coupled to an output (e.g., differential output) of the impedance converter 810 and an off capacitor 804 coupled between the RF signal ports 805a and 805b. The impedance converter 810 is coupled to the RF signal ports 805a and 805b to achieve a reduced area advantage (e.g., 20%). The RF signal ports 805a and 805b may receive a differential radio frequency signal, RF-in. The impedance converter 810 can realize a negative capacitance (−C) element and a negative impedance (−L) element that is suited for numerous applications. Although not shown, a bias circuit can be included in the impedance converter 810 of FIG. 8.

Figure 9:
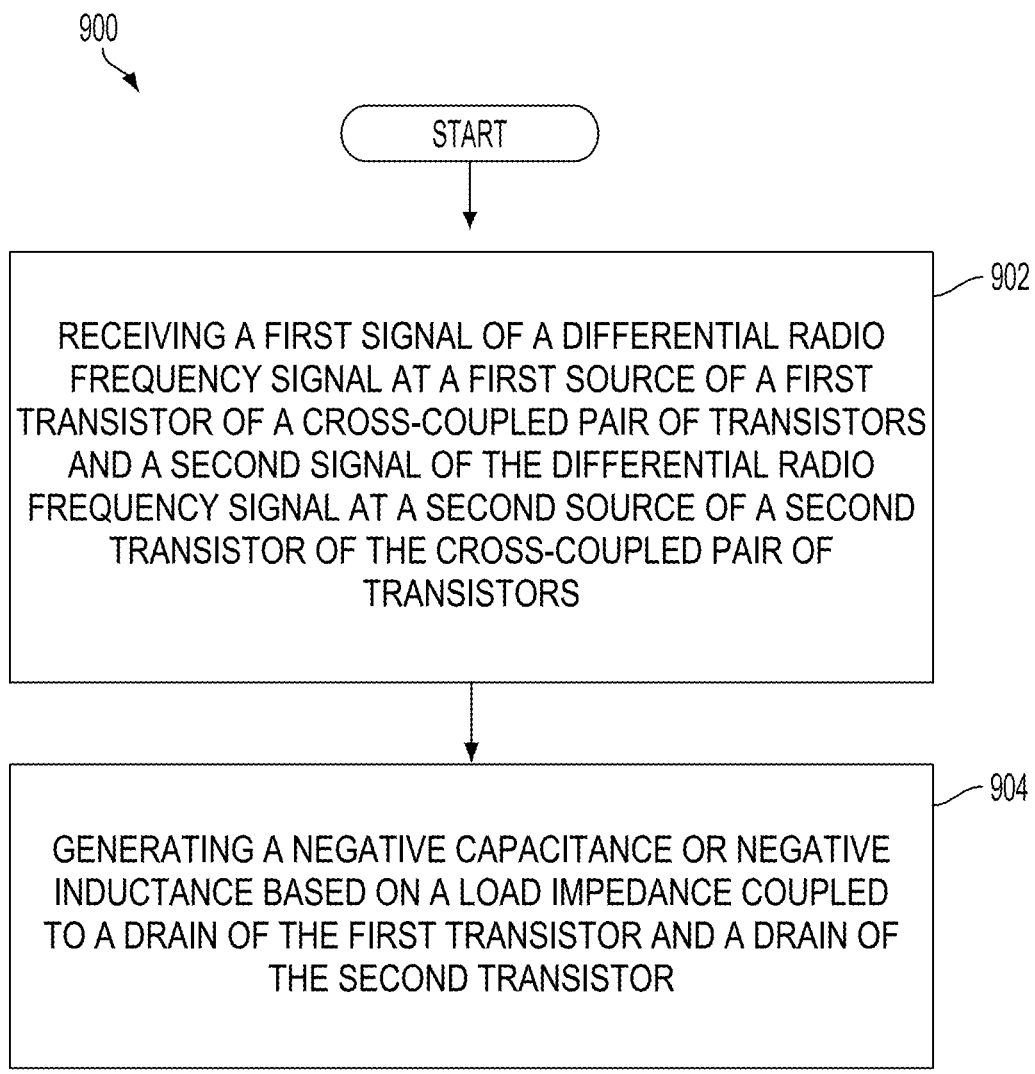
FIG. 9 depicts a simplified flowchart of a method to achieve negative impedance or negative inductance for impedance matching in a radio frequency front end.

FIG. 9 depicts a simplified flowchart 900 of a method to achieve negative impedance or negative inductance for impedance matching in a radio frequency front end. At block 902, a negative impedance converter circuit receives a first signal of a differential radio frequency signal at a first source of a first transistor of a cross-coupled pair of transistors and a second signal of the differential radio frequency signal at a second source of a second transistor of the cross-coupled pair of transistors. At block 904, the negative impedance converter circuit generates a negative capacitance or negative inductance based on a load impedance coupled to a drain of the first transistor and a drain of the second transistor.

According to a further aspect of the present disclosure, a negative impedance converter includes means for generating an opposition to a current when a voltage is applied. The opposition generating means may be the load impedance ZL, a capacitance and/or an inductance. In another aspect, the aforementioned means may be any module, or any apparatus configured to perform the functions recited by the aforementioned means.

Figure 10:
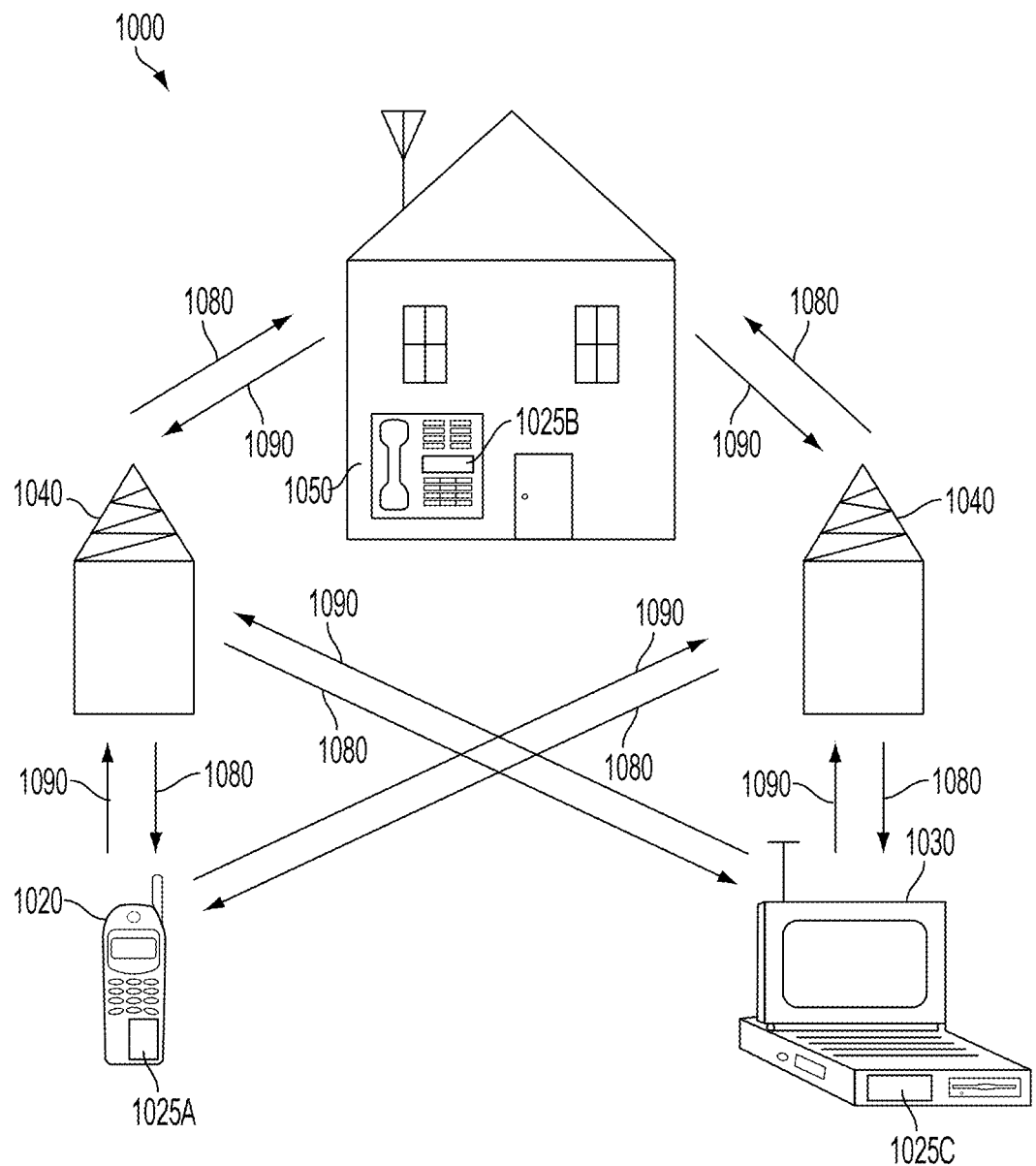
FIG. 10 is a block diagram showing an exemplary wireless communication system in which a configuration of the disclosure may be advantageously employed.

FIG. 10 is a block diagram showing an exemplary wireless communication system in which a configuration of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025B, and 1025C that include the disclosed negative impedance converter circuit. It will be recognized that other devices may also include the disclosed negative impedance converter circuit, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 10 illustrates remote units according to the aspects of the disclosure, the disclosure is not limited to these exemplary illustrated units.

Aspects of the disclosure may be suitably employed in many devices, which include the negative impedance converter circuit.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic device, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A negative impedance converter circuit, comprising:
   a first transistor having a source coupled between a first radio frequency (RF) input and a first input of a low noise amplifier (LNA); and
   a second transistor having a source coupled between a second RF input and a second input of the LNA, the first transistor and the second transistor coupled to an output of an antenna, the second transistor being cross-coupled to the first transistor to form a cross-coupled pair of transistors, the cross-coupled pair of transistors configured to generate a negative capacitance or a negative inductance based at least in part on a load impedance coupled to a drain of the first transistor and a drain of the second transistor.

2. The negative impedance converter circuit of claim 1, in which the load impedance includes an inductance or a capacitance.

3. The negative impedance converter circuit of claim 1, further comprising a first current source transistor and a second current source transistor respectively coupled to the drain of the first transistor and the drain of the second transistor.

4. The negative impedance converter circuit of claim 3, further comprising a first current sink transistor and a second current sink transistor respectively coupled to the source of the first transistor and the source of the second transistor.

5. The negative impedance converter circuit of claim 4, further comprising a mirror circuit to generate a control signal to bias the first current sink transistor and the second current sink transistor so that a current through the first current source transistor and the second current source transistor are substantially the same as the current through the first current sink transistor and the second current sink transistor.

6. The negative impedance converter circuit of claim 5, in which the mirror circuit further comprises a third current source transistor to mirror the first current source transistor and the second current source transistor, a third current sink transistor to mirror the first current sink transistor and the second current sink transistor, and a third transistor to mirror the first transistor and the second transistor.

7. The negative impedance converter circuit of claim 6, in which a drain of the third current sink transistor is coupled to a gate of the third current sink transistor, and the gate of the third current sink transistor is coupled to a gate of the first current sink transistor and a gate of the second current sink transistor to bias the first current sink transistor and the second current sink transistor.

8. The negative impedance converter circuit of claim 1, in which a drain of the first transistor is coupled to a gate of the second transistor, and a drain of the second transistor is coupled to a gate of the first transistor.

9. A method of generating a negative impedance with a negative impedance converter circuit, comprising:
   receiving a first signal of a differential radio frequency signal at a source of a first transistor of a cross-coupled pair of transistors and a second signal of the differential radio frequency signal at a source of a second transistor of the cross-coupled pair of transistors, the first signal and the second signal received from an output of an antenna; and
   generating a negative capacitance or negative inductance across a first and a second input of a low noise amplifier, the generating based at least in part on a load impedance coupled to a drain of the first transistor and a drain of the second transistor.

10. The method of claim 9, in which the load impedance includes an inductance or a capacitance.

11. The method of claim 9, further comprising generating a control signal to bias a first current sink transistor coupled to the source of the first transistor and a second current sink transistor coupled to the source of the second transistor.

12. The method of claim 11, further comprising biasing the first current sink transistor and the second current sink transistor so that a current through a first current source transistor coupled to the drain of the first transistor and a current through a second current source transistor coupled to the drain of the second transistor are substantially the same as a current through the first current sink transistor and the second current sink transistor.

13. A negative impedance converter circuit comprising:
   means for generating an opposition to a current when a voltage is applied; and
   means for generating a negative capacitance or negative inductance based at least in part on the opposition generating means coupled to a drain of a first transistor of a cross-coupled pair of transistors and a drain of a second transistor of the cross-coupled pair of transistors, the negative capacitance or negative inductance generating means coupled to a first and a second output of an antenna and to a first and a second input of a low noise amplifier (LNA).

14. The negative impedance converter circuit of claim 13, further comprising a first current source transistor and a second current source transistor respectively coupled to the drain of the first transistor and the drain of the second transistor.

15. The negative impedance converter circuit of claim 13, further comprising a first current sink transistor and a second current sink transistor respectively coupled to a source of the first transistor and a source of the second transistor.

16. The negative impedance converter circuit of claim 15, further comprising means for generating a control signal to bias the first current sink transistor and the second current sink transistor so that a current through a first current source transistor and a second current source transistor are substantially the same as a current through the first current sink transistor and the second current sink transistor.

17. The negative impedance converter circuit of claim 16, in which the means for generating the control signal further comprises a third current source transistor to mirror the first current source transistor and the second current source transistor, a third current sink transistor to mirror the first current sink transistor and the second current sink transistor, and a third transistor to mirror the first transistor and the second transistor.

18. The negative impedance converter circuit of claim 17, in which a drain of the third current sink transistor is coupled to a gate of the third current sink transistor, and the gate of the third current sink transistor is coupled to a gate of the first current sink transistor and a gate of the second current sink transistor to bias the first current sink transistor and the second current sink transistor.

19. The negative impedance converter circuit of claim 13, in which a drain of the first transistor is coupled to a gate of the second transistor, and a drain of the second transistor is coupled to a gate of the first transistor.

* * * * *